United States Patent [19]

Ninomiya

[11] 4,131,885

[45] Dec. 26, 1978

[54] PARALLEL-SERIAL ANALOG TO DIGITAL CONVERTERS

[75] Inventor: Takeshi Ninomiya, Tokyo, Japan

[73] Assignee: Sony Corporation, Tokyo, Japan

[21] Appl. No.: 681,507

[22] Filed: Apr. 29, 1976

[30] Foreign Application Priority Data

May 1, 1975 [JP] Japan .................................. 50-52030

[51] Int. Cl.² ........................................ H03K 13/175
[52] U.S. Cl. ..................... 340/347 AD; 340/347 CC; 340/347 M
[58] Field of Search .... 340/347 AD, 347 M, 347 CC; 324/99 D

[56] References Cited

U.S. PATENT DOCUMENTS

| | | | |
|---|---|---|---|
| 3,298,014 | 1/1967 | Stephenson | 340/347 AD |
| 3,311,910 | 3/1967 | Doyle | 340/347 AD |
| 3,541,315 | 11/1970 | Naydan et al. | 340/347 AD |
| 3,597,761 | 8/1971 | Fraschilla et al. | 340/347 AD |
| 3,860,952 | 1/1975 | Tallent et al. | 358/8 |
| 3,967,269 | 6/1976 | Fletcher | 340/347 AD |

OTHER PUBLICATIONS

Fletcher, A Video Analogue to Digital Converter, Oct. 1974, Report of the International Broadcasting Convention, pp. 47-57.
The Engineering Staff of Analog Devices, Inc., Analog-Digital Conversion Handbook, 6/1972, p. II--41.

Primary Examiner—Thomas J. Sloyan
Attorney, Agent, or Firm—Lewis H. Eslinger; Alvin Sinderbrand

[57] ABSTRACT

In an analog to digital converter in which each sampled portion of an incoming video or other analog signal is converted to a digital character in a plurality of parallel conversions occurring serially; the range of the voltage level reference signals of descending magnitude which are applied to comparators for effecting a relatively fine parallel conversion of a sampled analog signal is selected to be larger than, and offset in respect, to the steps or increments of the voltage level reference signals of descending magnitude which are applied to comparators for effecting a preceding relatively coarser parallel conversion, and the encoded outputs from the serially occurring parallel conversions are digitally added with the least significant bit of the encoded output from each preceding relatively coarser parallel conversion being accorded the same weight as the most significant bit of the encoded output from the next following relatively finer parallel conversion so as to eliminate from the result of the digital addition defects that would otherwise arise from inaccuracies in the voltage level reference signals and/or in the comparing operations of the comparators.

14 Claims, 10 Drawing Figures

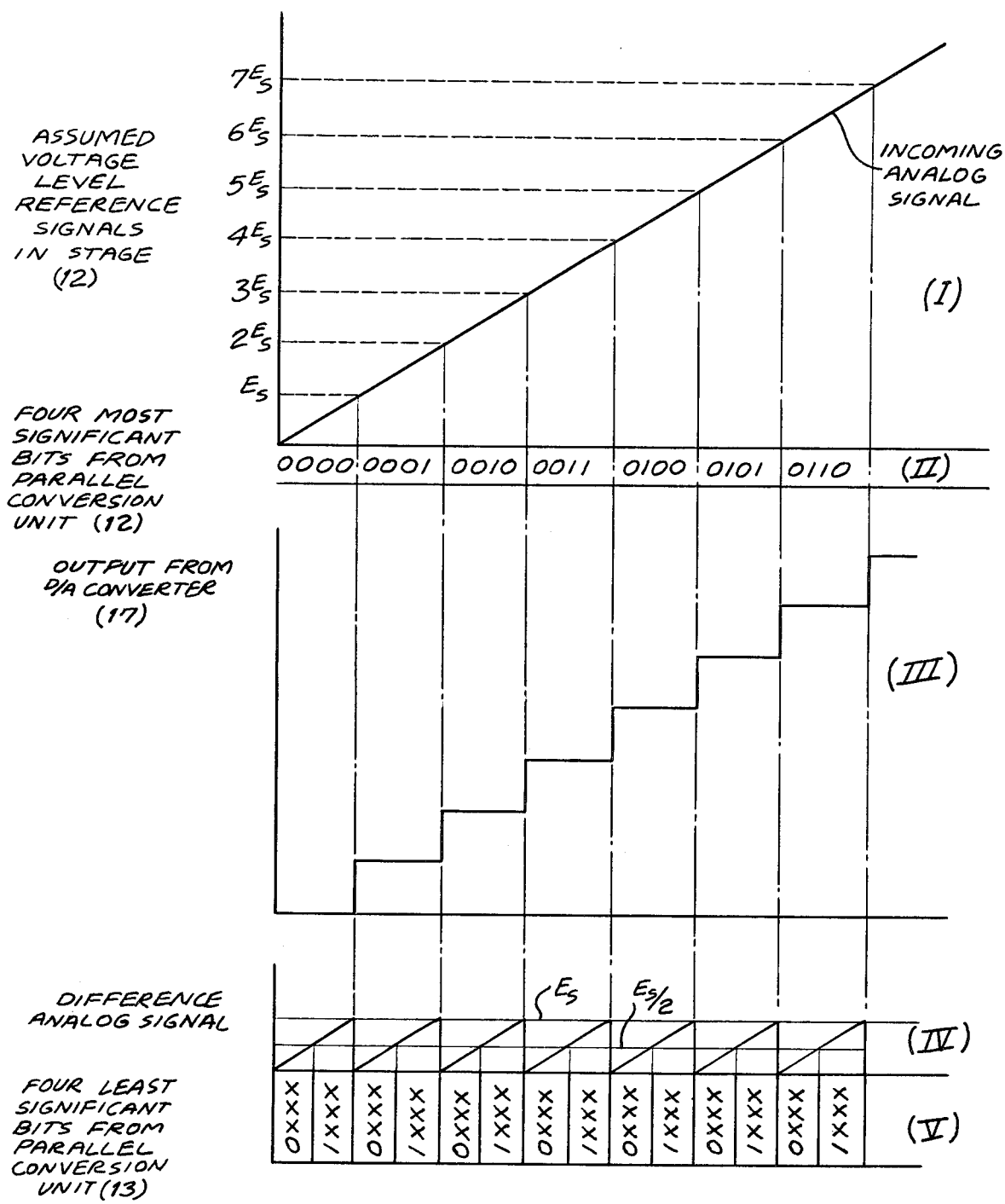

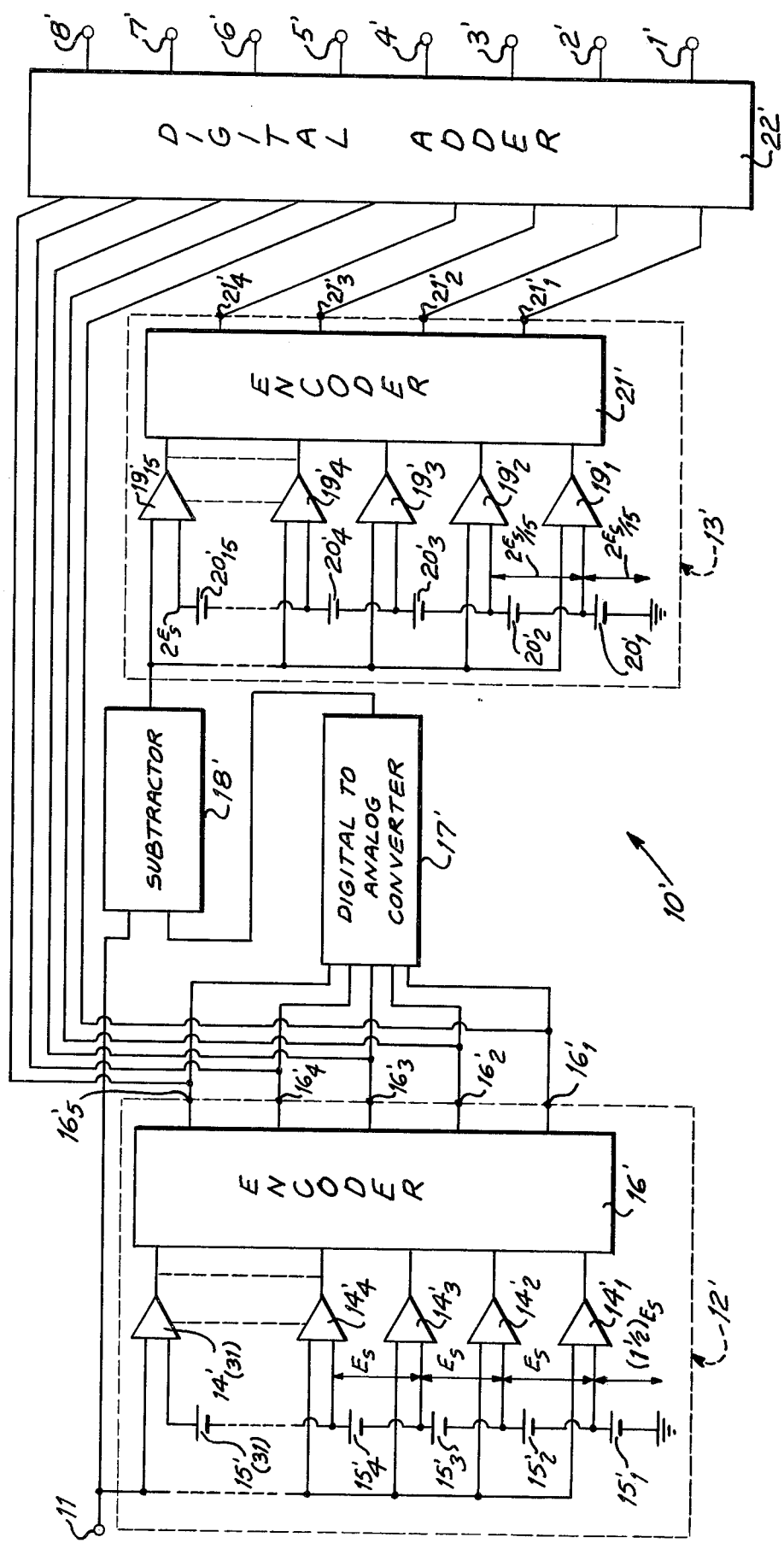

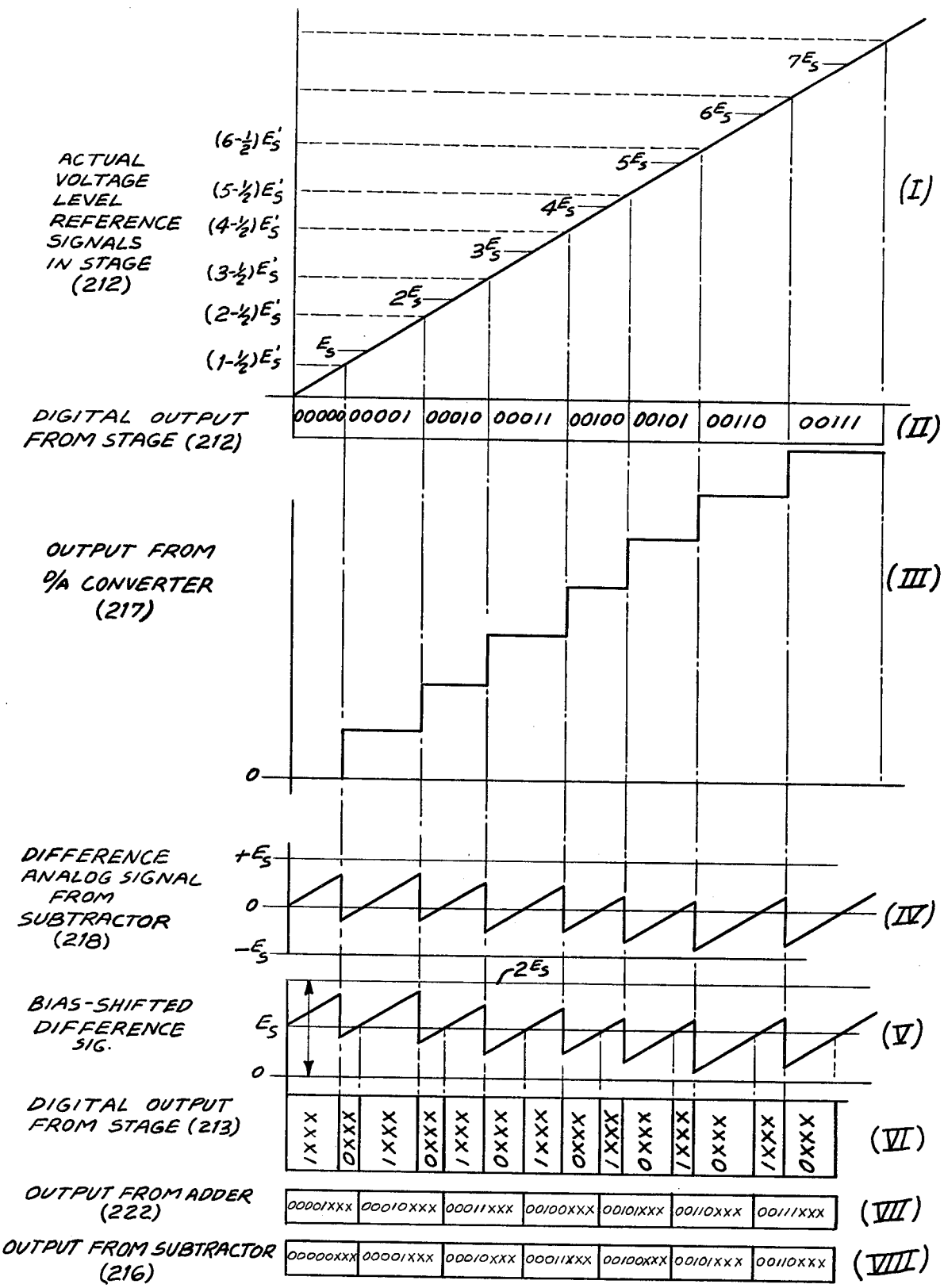

PARALLEL-SERIAL ANALOG TO DIGITAL CONVERTERS

BACKGROUND OF THE INVENTION

Field of the Invention

This invention relates generally to analog to digital converters, and more particularly is directed to improved analog to digital converters of the parallel-serial type which are especially suitable for use in video time base correctors.

Description of the Prior Art

Time base correctors are known for processing video or television signals to remove time base errors introduced during signal recording, reproducing or transmission. In such time base correctors, the incoming video signals are converted from analog to digital form and temporarily stored or written in a memory unit at a clocking rate which varies in a manner generally proportional to the time base errors; whereupon, the stored signals are fetched or read out of the memory unit at a standard clocking rate so as to remove the time base errors therefrom, and then the read-out signals are reconverted from digital form back to analog form.

Various types of analog to digital converters have been proposed, for example, for use in time base correctors as described above. In so-called parallel-type analog to digital converters, a sampled analog signal, such as the incoming video signal, is applied to a first compare input of each of a plurality of dual input comparators, while the second compare inputs of the comparators receive respective voltage level reference signals, for example, from respective voltage sources or from a voltage dividing network. The outputs of the comparators are coupled to an encoder which provides a binary or other encoded output or digital character comprised of a predetermined number of bits. Although analog to digital converters of the parallel type are capable of high speed operation, they have a number of inherent disadvantages. First of all, such converters require large numbers of comparators and of associated voltage sources or resistors in the voltage dividing network for providing the respective voltage level reference signals. More particularly, in parallel-type analog to digital converters, the required number of comparators and of respective voltage level reference signals is $2^k-1$, with k being the number of bits of binary codes desired in the output from the encoder. Thus, for example, if the output of the encoder is to contain 8-bits of binary codes, the required number of comparators is $2^8-1$ or 255, and a corresponding number of voltage sources are also required. Furthermore, in the described parallel-type analog to digital converters, any inaccuracies in the comparators and/or in the respective voltage level reference signals can produce defects in the signal that is obtained when the digitized output of the analog to digital converter is subsequently reconverted to analog form.

In other existing analog to digital converters of the so-called serial-type, a plurality of dual input comparators are arranged in a series of descending significance, with a digital-analog converter and a subtractor being arranged between each comparator and the next adjacent comparator of lower significance, and with the comparators receiving, at one of the inputs thereof, respective reference signals of descending voltage levels. The most significant comparator compares the sampled analog signal, such as the incoming video signal, with the respective voltage level reference signal to provide the most significant bit of the desired digital character or output. Each of the digital to analog converters converts the output of the preceding comparator or comparators to a corresponding analog signal which is then substracted, in the respective subtractor, from the incoming video signal to attain a difference signal which is compared in the next comparator with the respective voltage level reference signal for providing another respective bit of the desired digital output. The serial-type analog to digital converters, as briefly described above, require far fewer circuit elements than the parallel-type analog to digital converters. For example, if the digital output is to be made up of k binary bits, the serial-type converter requires k comparators, k voltage sources or the like for providing the voltage level reference signals, $k-1$ digital-analog converters, and $k-1$ subtractors. However, the serial-type analog to digital converters are not capable of high speed operation.

In view of the above, it has been proposed, for example, as disclosed in U.S. Pat. No. 3,860,952, to provide a so-called parallel-serial analog to digital converter for use in a video time base corrector with a view to attaining a high operating speed by means of a relatively fewer number of circuit elements as compared with the existing parallel-type analog to digital converters. In the known parallel-serial analog to digital converter, each sampled portion of an incoming video or other analog signal is converted to a digital character in two 4-bit parallel conversions which occur serially. The first parallel conversion is effected by a number of coarse comparators having first inputs which receive the sampled incoming analog signal and second inputs which receive voltage level reference signals of magnitudes descending in relatively large unit increments, and an encoder receives the outputs of the comparators for providing an encoded output specifying the four most significant bits of an 8-bit digital character representing the sampled incoming analog signal. Such output from the encoder of the first parallel conversion is converted to analog form and subtracted from the sampled incoming analog signal to provide an analog difference signal which is subjected to a second parallel conversion. The second parallel conversion is effected by a. number of fine comparators having first inputs which receive the analog difference signal and second inputs which receive voltage level reference signals of magnitudes descending in relatively small unit increments, with the maximum voltage level reference signal applied to a fine comparator being smaller than the minimum voltage level reference signal applied to a coarse comparator by one of said small unit increments. Finally, an encoder receives the outputs of the fine comparators for providing an encoded output specifying the four least significant bits of the 8-bit digital character representing the sampled incoming analog signal.

It has been found that the existing analog to digital converters of the parallel-serial type, as described above, are also disadvantageous in that inaccuracies in the comparators, particularly of the first parallel conversion, and/or of the respective voltage level reference signals can produce defects in the signal that is obtained when the digitized output of the analog to digital converter is subsequently reconverted to analog form.

OBJECTS AND SUMMARY OF THE INVENTION

Accordingly, an object of the present invention is to provide an improved analog to digital converter, for example, for use in a time base corrector, and which is free of all of the above described disadvantages of existing analog to digital converters.

More specifically, it is an object of this invention to provide an analog to digital converter which is composed of a relatively few circuit elements while being capable of high speed operation, and which reliably provides a digitized output accurately representing a sampled analog input signal so that such digitized output, when reconverted to analog form, precisely corresponds to the original input signal.

A further object is to provide an analog to digital converter, as aforesaid, which is of the so-called parallel-serial type.

In accordance with an aspect of this invention, in an analog to digital converter in which each sampled portion of an incoming video or other analog signal is converted to a digital character in a plurality of parallel conversions occurring serially, as aforesaid, the range of the voltage level reference signals of descending magnitude which are applied to comparators for effecting a relatively fine parallel conversion of a sampled analog signal is selected to be larger than, and offset in respect, to the steps or increments of the voltage level reference signals of descending magnitude which are applied to comparators for effecting a preceding relatively coarser parallel conversion, and the encoded outputs from the serially occurring parallel conversions are digitally added with the least significant bit of the encoded output from each preceding relatively coarser parallel conversion being accorded the same weight as the most significant bit of the encoded output from the next following relatively finer parallel conversion so as to eliminate from the result of the digital addition defects that would otherwise arise from inaccuracies in the voltage level reference signals and/or in the operations of the comparators.

The above, and other objects, features and advantages of the invention, will be apparent in the following detailed description of preferred embodiments thereof which is to be read in connection with the accompanying drawings.

BRIEF DESCRIPTION OF THE DRAWINGS

FIG. 2A graphically illustrates various outputs obtained when the converter of FIG. 1 is operating accurately in response to variations in the incoming video or other analog signal;

FIG. 3 is a schematic diagram similar to that of FIG. 1, but illustrating a parallel-serial analog to digital converter according to one embodiment of this invention;

FIG. 7 graphically illustrates various outputs in the converter of FIG. 6 in response to variations in the incoming analog signal.

DESCRIPTION OF THE PREFERRED EMBODIMENTS

Figure 1:
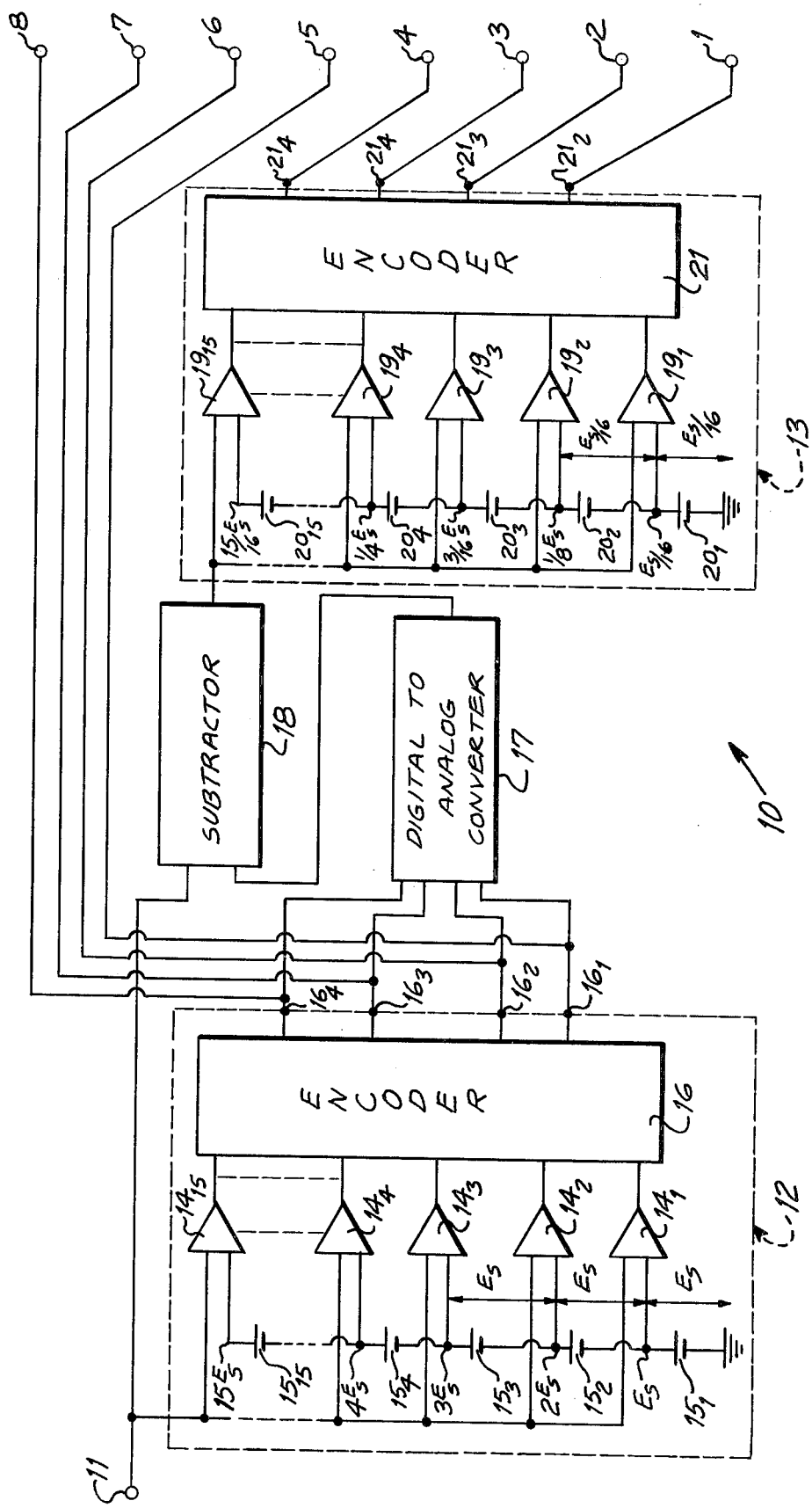
FIG. 1 is a schematic diagram illustrating a parallel-serial analog to digital converter according to the prior art.

Referring to the drawings in detail, and initially to FIG. 1 thereof, it will be seen that, in a parallel-serial analog to digital converter 10 according to the prior art, each sampled portion of an incoming video or other analog signal applied to an input terminal 11 is converted to an 8-bit digital character in two 4-bit parallel conversions which occur serially in units 12 and 13, respectively.

In the first, or coarse, parallel-conversion unit 12 for specifying the four most significant bits of the 8-bit digital character, the sampled incoming analog signal is applied from input terminal 11 to first inputs of a plurality of dual input coarse comparators $14_1$-$14_{15}$. The other or second inputs of comparators $14_1$-$14_{15}$ receive respective voltage level reference signals having magnitudes which descend in unit increments $E_s$ in the direction from comparator $14_{15}$ to comparator $14_1$. Such voltage level reference signals may be provided by a suitable voltage dividing network or, as shown, by a series circuit of voltage sources $15_1, 15_2, 15_3, \cdots 15_{15}$ each providing a potential equal to the respective unit increment $E_s$. Thus, the voltage level reference signals for the comparators $14_1, 14_2, 14_3, \cdots 14_{15}$ have the magnitudes $E_s, 2E_s, 3E_s, \cdots 15E_s$, respectively, so that comparators $14_1$-$14_{15}$ provide a first coarse conversion of the sampled incoming analog signal.

The outputs of comparators $14_1$-$14_{15}$ are coupled to a conventional encoder 16 which, for example, provides a binary encoded output at its four output terminals $16_1, 16_2, 16_3$ and $16_4$ specifying the four most significant bits of an 8-bit digital character representing the sampled incoming analog signal. Such encoded output from encoder 16 is reconverted to analog form in a digital to analog converter 17, and the resulting analog signal is subtracted from the sampled incoming analog signal applied to terminal 11 in a subtracter 18 so as to provide a difference analog signal which is subjected to a fine conversion in the second or fine parallel conversion unit 13.

As shown, in fine parallel conversion unit 13, the difference analog signal from subtractor 18 is applied to first inputs of dual input fine comparators $19_1$-$19_{15}$, while second inputs of such comparators receive voltage level reference signals having magnitudes which descend in unit increments of $E_s/16$ in the direction from comparator $19_{15}$ to comparator $19_1$. Such voltage level reference signals may be applied to comparators $19_1$-$19_{15}$ from a suitable voltage dividing network or, as shown, may be provided by a series circuit of voltage sources $20_1$-$20_{15}$ each providing a voltage or potential equal to the respective unit increment $E_s/16$. Thus, the voltage level reference signals applied to fine comparators $19_1, 19_2, 19_3 \cdots 19_{15}$ have magnitudes of $E_s/16$, $2E_s/16, 3E_s/16, \cdots 15E_s/16$, respectively. As a result of the foregoing, the converting range of parallel conversion unit 13 is substantially equal to the steps or increments $E_s$ in the converting range of the preceding parallel conversion unit 12. The outputs of fine comparators $19_1-19_{15}$ are coupled to a conventional encoder 21 which provides, at outputs $21_1, 21_2, 21_3$ and $21_4$, a respective binary encoded output specifying the four least significant bits of the digital output representing the sampled incoming analog signal. Finally, the four least significant bits of the digital character are led from outputs $21_1, 21_2, 21_3$ and $21_4$ of encoder 21 to output terminals 1,2,3 and 4, respectively, while the four most significant bits of the digital character are led from outputs $16_1, 16_2, 16_3$ and $16_4$ of encoder 16 to output terminals 5,6,7 and 8, respectively.

It will be apparent that, in the above described analog to digital converter 10 according to the prior art, the number of comparators in each of the parallel conversion units 12 and 13 is $(2^K-1)$, in which K is the number of bits in the digitized output from the respective encoder 16 or 21. Similarly, the number of voltage sources required for establishing the voltage level reference signals for such comparators in each of the units or stages 12 and 13 is $(2^K-1)$. Thus, in the case where the units or stages 12 and 13 each have 4-bit outputs, each unit or stage requires fifteen comparators and fifteen voltage sources, as shown. If a similar 8-bit output was to be obtained from merely a parallel-type analog to digital converter, that is, with a single parallel conversion stage, such single stage would require $(2^8-1)$, that is, 255, comparators and the same number of voltage sources for establishing the respective voltage level reference signals. Thus, the known parallel-serial analog to digital converter does very substantially reduce the numbers of circuit elements required, while being capable of relatively high speed operation.

Referring now to FIG. 2A, it will be seen that, so long as the voltage level reference signals applied to the comparators $14_1-14_{15}$ of coarse conversion unit or stage 12 have the correct values and such comparators effect accurate comparisons of the inputs applied thereto, increasing values of the incoming video or other analog signal applied to input terminal 11, as indicated at (I), will effect the changes in the logics of the 4-bit digital output from encoder 16, that is, the four most significant bits of the digital output appearing at output terminals 8,7,6 and 5, respectively, as shown at (II). In response to such changes in the digital output from encoder 16, the analog output from digital to analog converter 17 will vary in a stepwise manner, as indicated at (III), with each step in the output from converter 17 corresponding to a respective unit increment or step in the voltage level reference signals applied to comparators $14_1-14_{15}$. For variations of the incoming analog signal between the steps of the voltage level reference signals, the difference analog signal applied from subtracter 18 to the comparators $19_1-19_{15}$ of the fine conversion unit or stage 13 will correctly have a range of $E_s$, as indicated at (IV). Therefore, for variations of the incoming analog signal between two successive voltage level reference signals, for example, between $3E_s$ and $4E_s$, the four least significant bits of the digital output applied from encoder 21 to output terminals 4,3,2 and 1, respectively, will have logics ranging from 0000 to 1111, as indicated at (V) in which the symbol X indicates the logic 0 or 1.

Figure 2B:
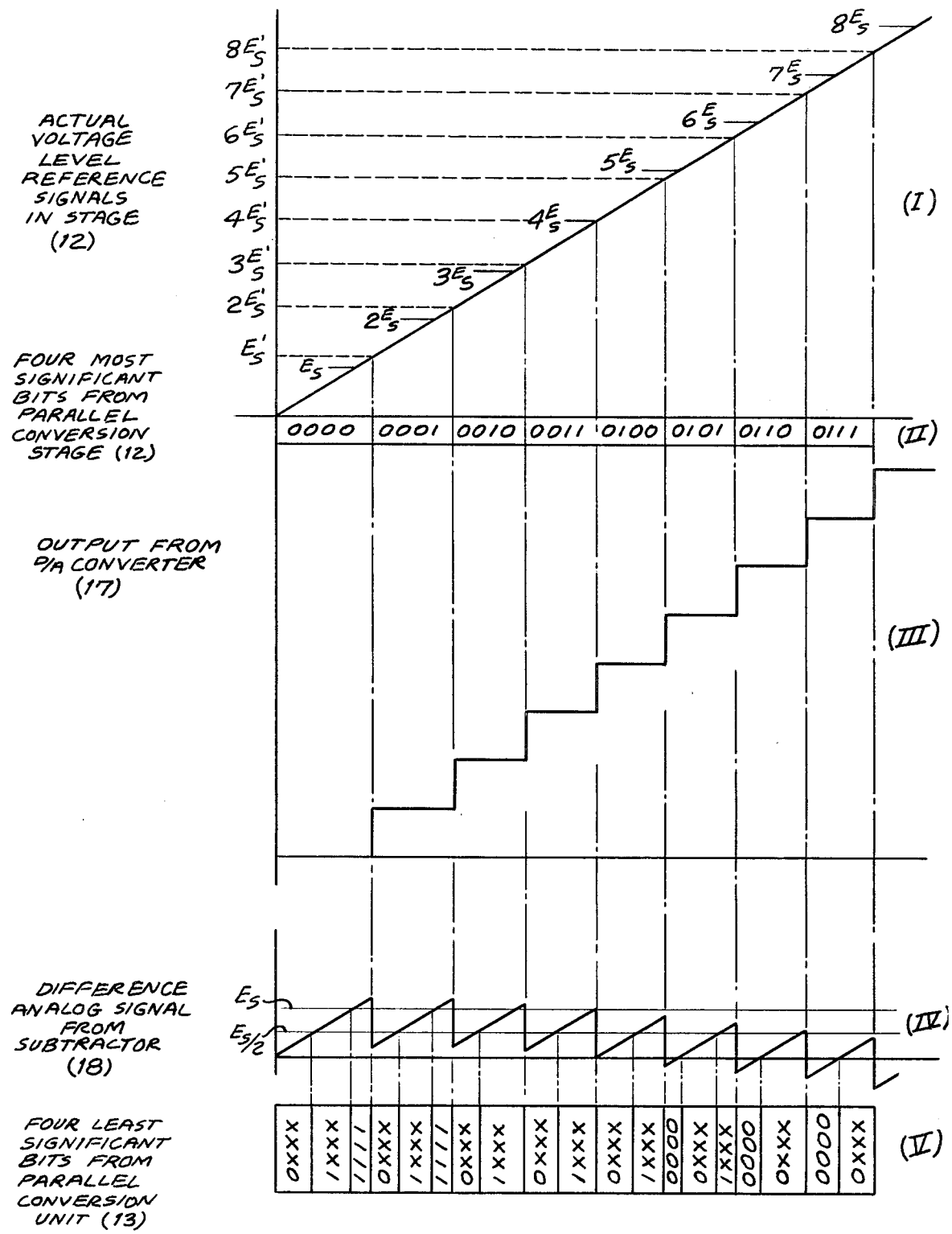
FIG. 2B is similar to FIG. 2A, but graphically illustrates the outputs obtained when reference signals deviate from standard levels in the converter of FIG. 1.

However, if the comparators $14_1-14_{15}$ of the coarse conversion stage or unit 12 do not accurately compare the signals applied thereto, or if the actual voltage level reference signals applied to such comparators have values $E'_s, 2E'_s, 3E'_s \cdots$ etc. which deviate from the desired values $E_s, 2E_s, 3E_s \cdots$ etc., respectively as indicated at (I) on FIG. 2B, then changes in logics of the four most significant bits of the digital output, as indicated at (II) on FIG. 2B, and the steps in the analog output from converter 17, as indicated at (III) on FIG. 2B, will not accurately correspond to the desired steps in voltage level references signals for the coarse conversion stage 12. As a result of the foregoing, the difference analog signal applied from subtracter 18 to the comparators $19_1-19_{15}$ of the fine conversion stage 13 may extend above the value $E_s$ or attain negative values, as indicated at (IV) on FIG. 2B.

Figure 2C:
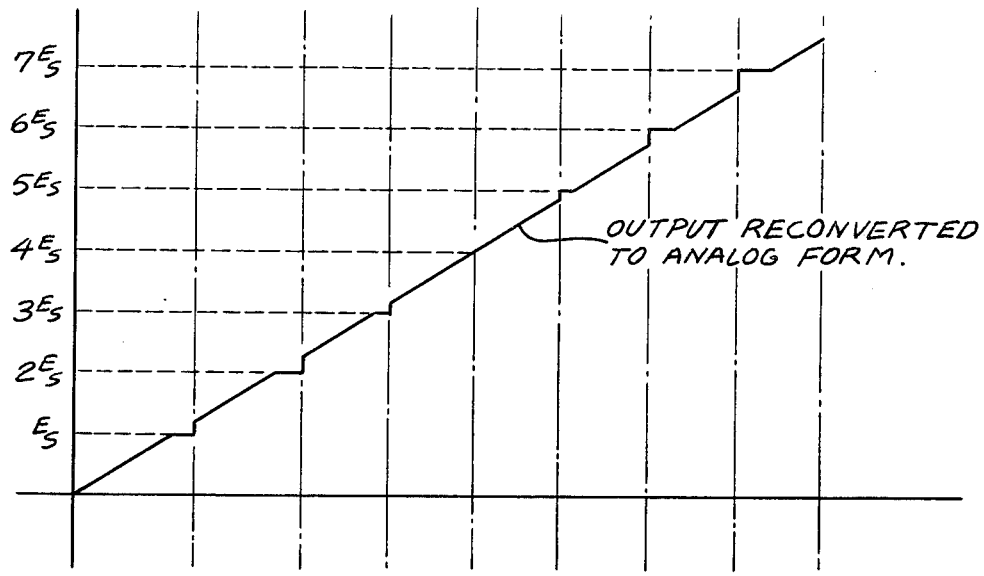
FIG. 2C graphically illustrates the analog signal obtained from the outputs of FIG. 2B when reconverted to analog form, and to which reference will be made in explaining a problem associated with the known analog to digital converter.

By reason of the foregoing, the 8-bit digital character or output from converter 10 may not accurately correspond to the incoming video or other analog signal. For example, if the incoming analog signal has a value varying between $2E_s$ and $2E'_s$, the 8-bit digital character at the output of converter 10 will remain fixed at 00011111, as indicated at (II) and (V) on FIG. 2B. Similarly, in the illustrated example, if the incoming analog signal has a value varying between $6E'_s$ and $6E_s$, the 8-bit digital character at the output of converter 10 will remain fixed at 01100000. Accordingly, when the digital output from converter 10 is subsequently reconverted to analog form, the resulting analog signal shown on FIG. 2C will not accurately correspond to the original incoming analog signal shown at (I) on FIG. 2B.

Referring now to FIG. 3, it will be seen that, in a parallel-serial analog to digital converter 10' according to an embodiment of this invention, the several components corresponding to those included in the above described known converter 10 are identified by the same reference numerals, but with a prime (') appended thereto. Generally, the converter 10' according to this invention is similar to the previously known converter 10 and differs from the latter in that the range of the voltage level reference signals applied to the comparators $19'_1-19'_{15}$ of the fine parallel conversion unit or stage 13' is larger than, and offset in respect to, the steps or increments in the voltage level reference signals applied to the comparators $14'_1-14'_{(2^K-1)}$ of the coarse parallel conversion unit or stage 12', and in that the digital outputs of encoders 16' and 21' of the stages or units 12' and 13', respectively, are digitally added, as in a digital adder 22, with the least significant bit of the encoded output from the coarse parallel conversion stage 12' being accorded the same weight as the most significant bit of the encoded output from the next following or relatively finer parallel conversion stage 13', so as to eliminate from the 8-bit digital character obtained at output terminals 1'-8', that is, the result of the digital addition, the previously described defects that would otherwise arise from inaccuracies in the voltage level reference signals and/or in the comparing operations of the comparators, particularly in the coarse conversion stage 12'.

In the case where the sampled incoming video or other analog signal applied to input terminal 11' is to be converted to an 8-bit digital character by means of two serially occurring parallel conversions in the converter 10', the first or coarse parallel conversion stage or unit 12' is arranged to provide a 5-bit output, while the second or fine parallel conversion stage or unit 13' is arranged to again provide a 4-bit output, as shown, so that the least significant bit of the 5-bit output and the most significant bit of the 4-bit output can be accorded the same weight in the digital adder 22 for producing the desired 8-bit digital character or output corresponding to the sampled incoming analog signal.

More particularly, it will be seen that, in the first or coarse parallel-conversion unit 12', the sampled incoming analog signal is applied from input terminal 11' to first inputs of a plurality of dual input coarse comparators $14'_1$–$14'_{31}$. Thus, it will be seen that the number of comparators in conversion stage 12' is again ($2^K - 1$), but with K now being 5. The other or second inputs of comparators $14'_1$–$14'_{31}$ receive respective voltage level reference signals having magnitudes which descend in unit increments $E_s$ in the direction from comparator $14'_{31}$ to comparator $14_1$. Such voltage level reference signals may be provided by a suitable voltage dividing network or, as shown, by a series circuit of voltage sources $15'_1$, $15'_2$, $15'_3$,---$15'_{31}$, with the voltage source $15'_1$ providing a voltage or potential of, for example, $(1+\frac{1}{2})E_s$, and with each of the other voltage sources $15'_2$–$15'_{31}$ each providing a potential equal to the respective unit increment $E_s$. Thus, the voltage level reference signals for the comparators $14'_1$, $14'_2$, $14'_3$---$14'_{31}$ have the magnitudes $(1+\frac{1}{2})E_s$, $(2+\frac{1}{2})E_s$, $(3+\frac{1}{2})E_s$---$(31+\frac{1}{2})E_s$, respectively, so that comparators $14'_1$–$14'_{31}$ provide a first coarse conversion of the sampled incoming analog signal.

The outputs of comparators $14'_1$–$14'_{31}$ are coupled to a conventional encoder 16' which, for example, provides a binary encoded output at its five output terminals $16'_1$, $16'_2$, $16'_3$, $16'_4$ and $16'_5$ specifying five most significant bits of an 8-bit digital character representing the sampled incoming analog signal. As before, such encoded output from encoder 16' is reconverted to analog form in a digital to analog converter 17', and the resulting analog signal is subtracted from the sampled incoming analog signal applied to terminal 11' in a subtracter 18' so as to provide a difference analog signal which is subjected to a fine conversion in the second or fine parallel conversion unit 13'.

As shown, in fine parallel conversion unit 13', the difference analog signal from subtracter 18' is applied to first inputs of fifteen ($2^K - 1$) dual input fine comparators $19'_1$–$19'_{15}$. In the illustrated embodiment of this invention, the voltage level reference signals applied to the second inputs of comparators $19'_1$–$19'_{15}$ have magnitudes which descend in unit increments of, for example, $2E_s/(2^K - 1)$, that is $2E_s/15$, from a maximum voltage level reference signal of $2E_s$ for the comparator $19'_{15}$ to a minimum voltage level reference signal of $2E_s/15$ for the comparator $19'_1$. Such voltage level reference signals may be applied to comparators $19'_1$–$19'_{15}$ from a suitable voltage dividing network or, as shown, may be provided by a series circuit of voltage sources $20'_1$–$20'_{15}$ each providing a voltage or potential equal to the respective unit increment $2E_s/15$. Thus, the voltage level reference signals applied to fine comparators $19'_1$, $19'_2$, $19'_3$---$19'_{15}$ have magnitudes of $2E_s/15$, $4E_s/15$, $6E_s/15$---$2E_s$, respectively. As a result of the foregoing, the range $2E_s/15$ to $2E_s$ of the voltage level reference signals applied to fine comparator $19'_1$–$19'_{15}$ in parallel conversion unit 13' is larger than the increments $E_s$ of the voltage level reference signals applied to the comparators in the preceding parallel conversion stage or unit 12'. Further, the range of the voltage level reference signals employed in conversion unit or stage 13', that is, the converting range of the latter, is offset by about $\frac{1}{2}E_s$ in respect to the steps in the voltage level reference signals employed in the preceding stage 12'.

Figure 4B:
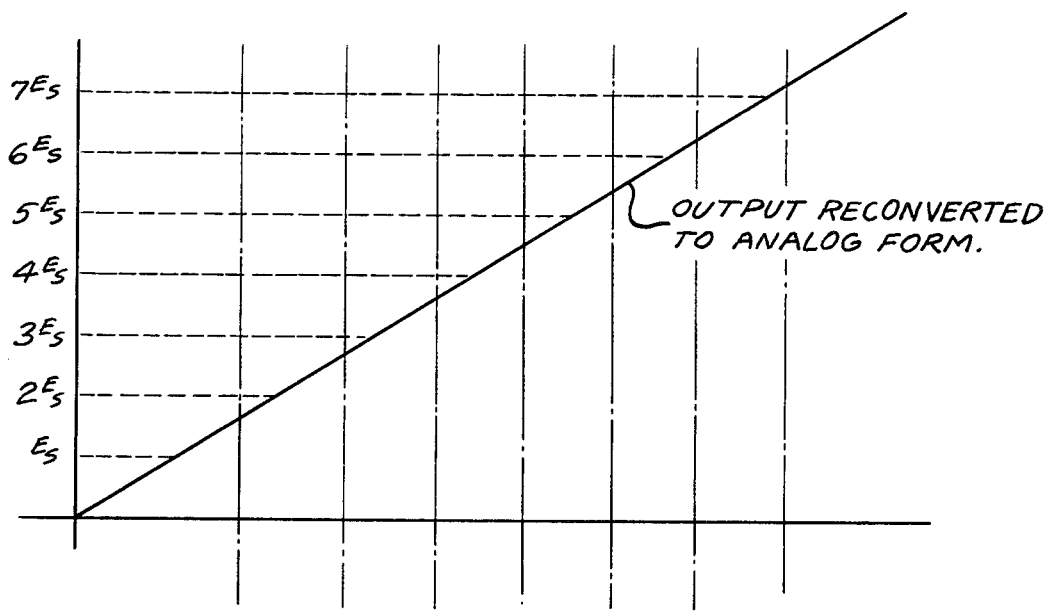
FIG. 4B graphically illustrates the analog signal obtained when the digital output of the converter of FIG. 3 is reconverted to analog form.
Figure 4A:
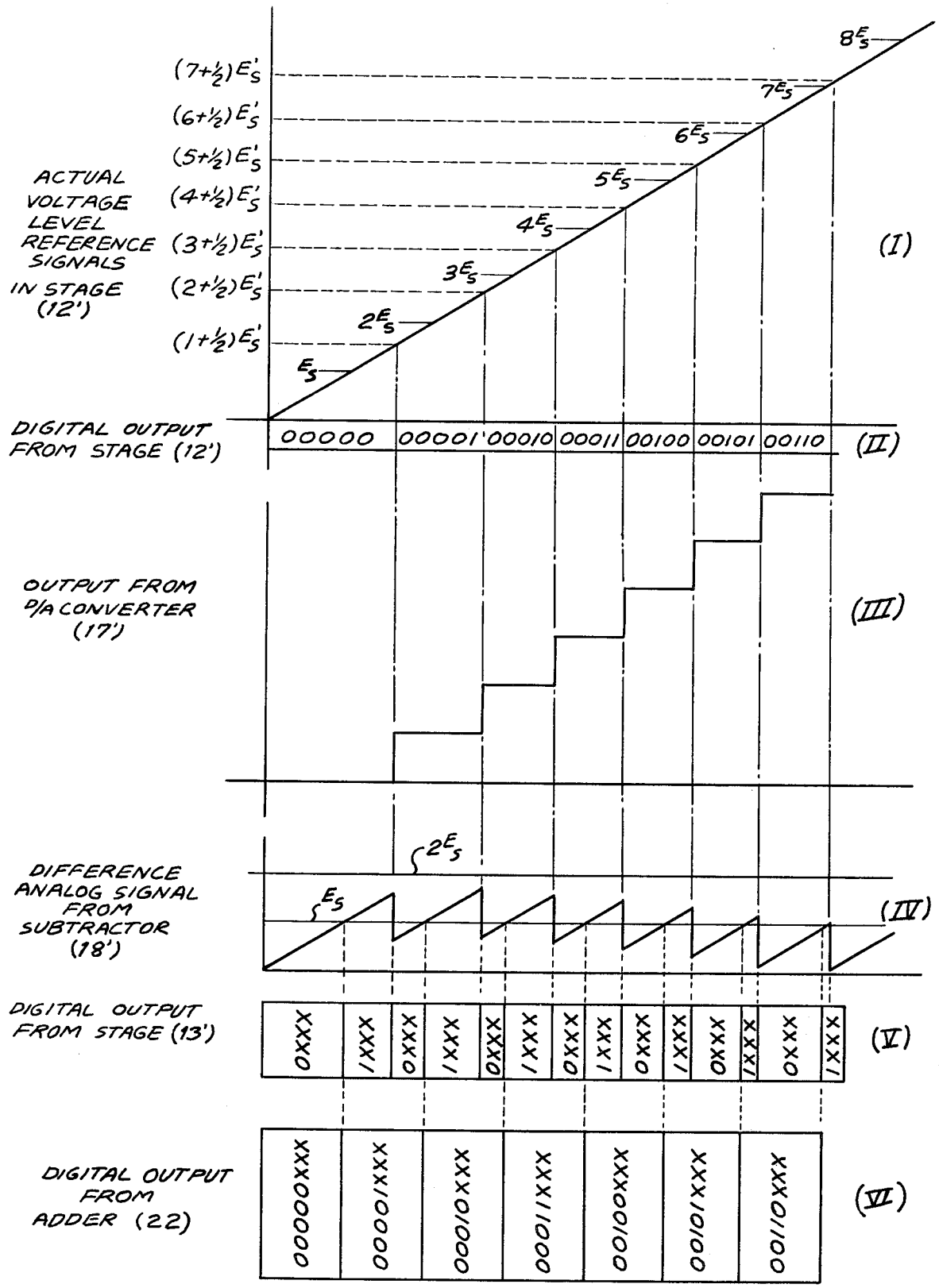
FIG. 4A shows graphic illustrations similar to those of FIG. 2B but for the converter according to this invention as illustrated on FIG. 3.

The outputs of fine comparators $19'_1$–$19'_{15}$ are coupled to a conventional encoder 21' which provides, at outputs $21'_1$, $21'_2$, $21'_3$ and $21'_4$, a respective binary encoded output specifying the four least significant bits of the digital character representing the sampled incoming analog signal. Finally, the four least significant bits appearing at outputs $21'_1$, $21'_2$, $21'_3$ and $21'_4$ of encoder 21' and the five most significant bits appearing at outputs $16'_1$, $16'_2$, $16'_3$, $16'_4$ and $16'_5$ of encoder 16' are applied to respective inputs of digital adder 22 which, as indicated previously, gives equal weight to the bits appearing at outputs $16'_1$ and $21'_4$ so as to provide the desired 8-bit digital character at output terminals 1', 2', 3', 4', 5', 6', 7' and 8'. Referring now to FIG. 4A, it will be seen that the parallel-serial analog to digital converter 10' according to this invention will provide an 8-bit digital character which accurately corresponds to the sampled incoming analog signal even if the comparators $14'_1$–$14'_{31}$ of the coarse conversion stage or unit 12' do not accurately compare the signals applied thereto, or if the actual voltage level reference signals applied to such comparators have values $(1+\frac{1}{2})E'_s$, $(2+\frac{1}{2})E'_s$, $(3+\frac{1}{2})E'_s$---$(31+\frac{1}{2})E'_s$ which may differ from the respective desired values by as much as $\frac{1}{2}E_s$, as shown at (I) on FIG. 4A. Increasing values of the incoming video or other analog signal applied to input terminal 11', as indicated at (I), will effect the changes in the logics of the 5-bit digital output from encoder 16' shown at (II). In response to such changes in the digital output from encoder 16', the analog output from digital to analog converter 17' will vary in a stepwise manner, as indicated at (III), with each step in the output from converter 17' corresponding to a respective increment or step in the voltage level reference signals applied to comparators $14'_1$–$14'_{31}$. For variations of the incoming analog signal between the steps of the voltage level reference signals actually applied to the comparators in conversion stage 12', the difference analog signal applied from subtracter 18' to the comparators $19'_1$–$19'_{15}$ of the fine conversion unit or stage 13 will always lie in the range between 0 and $2E_s$, as indicated at (IV). Therefore, for variations of the incoming analog signal between two successive actual voltage level reference signals, for example, between $(1+\frac{1}{2})E'_s$ and $(2+\frac{1}{2})E'_s$, the four bits of digital information appearing at outputs $21'_4$, $21'_3$, $21'_2$ and $21'_1$ of encoder 21' will have logics ranging from 0000 to 1111, as indicated at (V) on FIG. 4A.

When the 5-bit output from encoder 16' is digitally added to the 4-bit output from encoder 21' with the least significant bit of the output from encoder 16' (II) being given the same weight as the most significant bit from encoder 21', the resulting 8-bit digital output from adder 22 has the logics indicated at (VI) on FIG. 4A. It will be seen that, even though the actual voltage level reference signals applied to comparators $14'_1$ and $14'_2$ in conversion stage 12' are shown at (I) to have values $(1+\frac{1}{2})E'_s$ and $(2+\frac{1}{2})E'_s$ that are respectively greater than the intended values $(1+\frac{1}{2})E_s$ and $(2+\frac{1}{2})E_s$, the 8-bit digital character obtained from adder 22 for a sampled incoming analog signal ranging, for example, from $E_s$ to $2E_s$, correctly has logics ranging from 00001000 to 00001111, as shown at VI on FIG. 4A. Accordingly, when the digital output from converter 10' is subsequently reconverted to analog form, the resulting analog signal shown on FIG. 4B will accurately correspond to the original incoming analog signal shown at (I) on FIG. 4A.

As previously noted, in the above described converter 10' according to this invention, the range of the voltage level reference signals applied to the comparators in the fine conversion stage or unit 13' is larger than, and offset by $\frac{1}{2}E_s$ with respect to, the steps in the voltage level reference signals applied to the comparators in the coarse conversion unit 12' so as to compensate for inaccuracies as large as $\frac{1}{2}E_s$ in the voltage level reference signals applied to comparators $14'_1$–$14'_{31}$ or in the comparing operations of such comparators. However, such inaccuracies are not likely to be so large as $\frac{1}{2}E_s$ so that the described offset may be reduced and the number of comparators in the fine conversion stage 13' may be correspondingly lowered. For example, if it is desired to compensate for inaccuracies no greater than about $\frac{1}{4}E_s$, the voltage level reference signals applied to comparators $14'_1$–$14'_{31}$ in conversion stage 12' may remain as before, while the conversion stage 13' is provided with only thirteen comparators $19'_1$–$19'_{13}$ which have voltage level reference signals $2E_s/15$, $4E_s/15$, $5E_s/15$---$26E_s/15$, respectively, applied thereto. In the latter case, the range of the voltage level reference signals applied to the comparators in stage 13' is still larger than, and offset in respect to the steps of the voltage level reference signals applied to, the comparators in the preceding conversion stage 12'.

In the converter 10' according to this invention, only two serially occurring parallel conversions are employed for providing an 8-bit digital character or output corresponding to the incoming sampled analog signal. However, it will be noted that the present invention may be similarly applied to analog to digital converters in which three or more parallel conversions occur serially to provide, for example, a 12-bit digital character or output.

Figure 5:
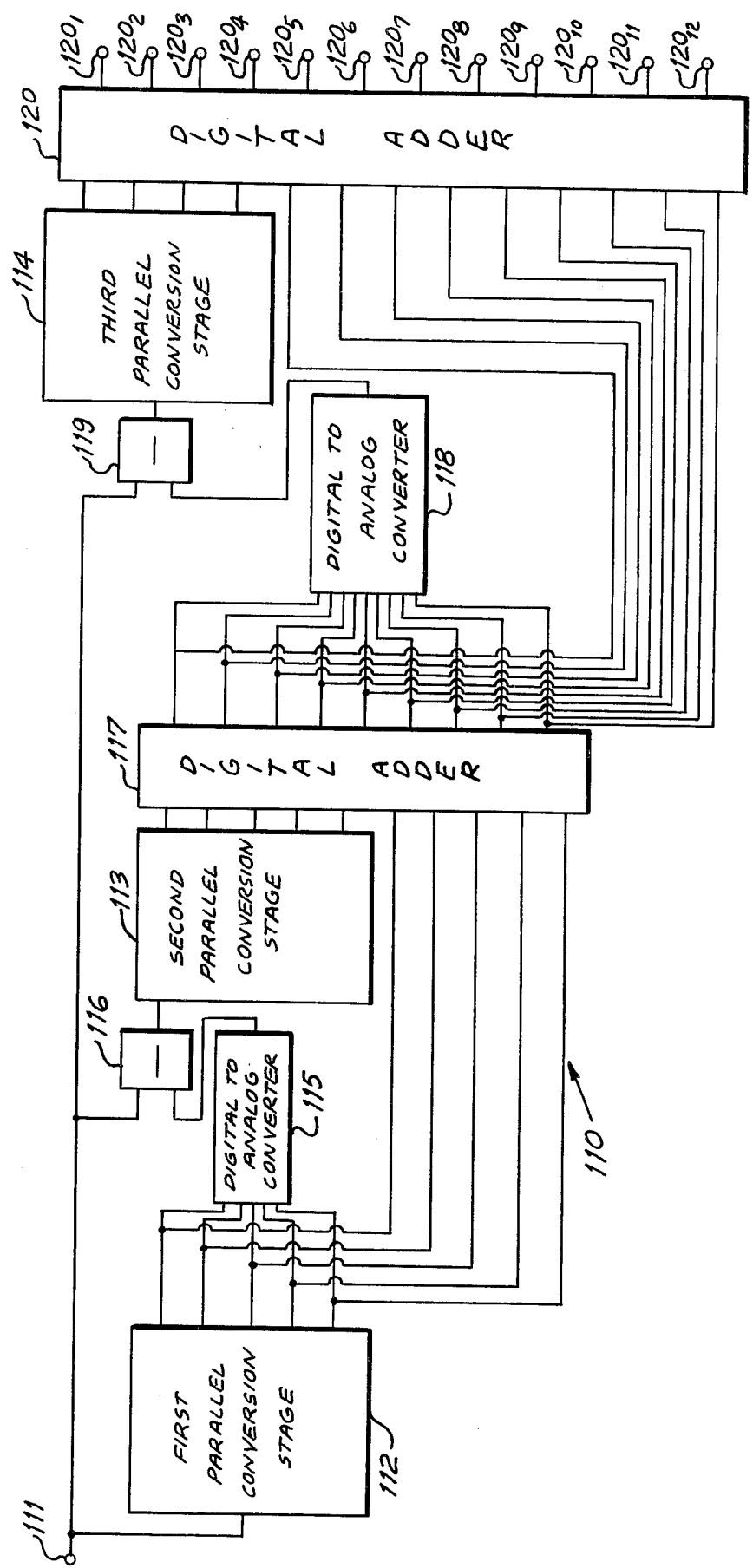
FIG. 5 is a schematic diagram illustrating a parallel-serial analog to digital converter according to another embodiment of this invention.

For example, as shown on FIG. 5, an analog to digital converter 110 according to this invention may effect three serially occurring parallel conversions of the sampled incoming analog signal applied to input terminal 111 by means of first, second and third parallel conversion stages or units 112, 113 and 114, respectively. The first or coarsest parallel conversion stage 112 may correspond to the stage or unit 12' of the previously described converter 10' and provide a 5-bit digital output in response to the conversion effected by $(2^K - 1)$ or thirty-one coarse comparators which, as in the case of the stage or unit 12', receive voltage level reference signals $(1+\frac{1}{2})E_s$, $(2+\frac{1}{2})E_s$, $(3+\frac{1}{2})E_s$---$(31+\frac{1}{2})E_s$, respectively. The 5-bit digital output from stage or unit 112 is applied to a digital to analog converter 115 which provides a corresponding analog signal to a subtractor 116 for subtraction in the latter from the sampled incoming analog signal applied to input terminal 111. The resulting analog difference signal from subtractor 116 is applied to the second parallel conversion stage or unit 113 which is operative to provide a 5-bit digital character or output corresponding to such analog difference signal.

The second parallel conversion stage or unit 113 may also be similar to the previously described stage or unit 112 in that it includes $(2^K - 1)$ or thirty-one comparators receiving the analog difference signal and comparing the same with respective voltage level reference signals. However, in the case of the stage or unit 113 which effects a finer conversion than the preceding stage or unit 112, the increments between the successive voltage level reference signals are $2E_s/(2^K-1)$, that is, $2E_s/31$, and the lowest voltage level reference signal is $$\frac{3}{2}\left(\frac{2E_s}{31}\right)$$

or $3E_s/31$. Accordingly, in the second conversion stage 113, the voltage level reference signals for the thirty-one comparators range from a minimum of $3E_s/31$ to a maximum of $(2+1/31)E_s$. Thus, the range of the voltage level reference signals in the second conversion stage 113 is larger than, and offset in respect to, the steps in the voltage level reference signals in the preceding first conversion stage 112.

Alternatively, the first and second parallel conversion stages 112 and 113 can be identical, that is, provided with the same voltage level reference signals, if an amplifier (not shown) with an amplification factor of 31/2 is interposed between subtracter 116 and the second conversion stage 113.

The 5-bit digital output from the first coarse parallel conversion stage 112 and the 5-bit digital output from the finer second parallel conversion stage 113 are applied to a digital adder 117 with the least significant bit of the output from stage 112 and the most significant bit of the output from stage 113 being accorded the same weight to provide a 9-bit digital output from adder 117. Such 9-bit digital output from adder 117 is applied to a digital to analog converter 118 which provides a corresponding analog signal to a subtracter 119 for subtraction in the latter from the sampled incoming analog signal applied to input terminal 111. The resulting analog difference signal from subtracter 119 is applied to the third or finest parallel conversion stage or unit 114 which is operative to provide a 4-bit digital character or output corresponding to the analog difference signal from subtracter 119.

The third or finest parallel conversion stage 114 having a 4-bit digital output may be similar to the previously described conversion stage 13' in that it includes $(2^K - 1)$ or fifteen comparators receiving the analog difference signal from subtracter 119 and comparing the same with respective voltage level reference signals. However, in the case of the stage or unit 114 which effects a still finer conversion than the preceding stage 113, the increments between the successive voltage level reference signals are $$\frac{2}{(2^4 - 1)} \cdot \frac{2E_s}{(2^5 - 1)}$$

or $4E_s/465$ with the smallest voltage level reference signal in stage 114 being $4E_s/465$ and the largest voltage level reference signal in that stage being $15(4E_s/465)$ or $4E_s/31$. Thus, the range of the voltage level reference signals applied to the comparators in the finest or third parallel conversion stage 114 is larger than, and offset in respect to, the steps in the voltage level reference signals applied to the comparators in the preceding second parallel conversion stage 113.

Finally, as shown, the 9-bit digital output from digital adder 117 and the 4-bit digital output from the third stage 114 are digitally added in a digital adder 120 with the least significant bit of the output from digital adder 117 being accorded the same weight as the most significant bit of the output from third stage 114. Thus, the digital addition in adder 120 provides a 12-bit digital output at its output terminals $120_1$–$120_{12}$. In a manner similar to that described above with reference to FIGS. 3, 4A and 4B, the 12-bit digital output of converter 110 according to this invention is made to accurately correspond to the sampled incoming analog signal even when inaccuracies exist in the voltage level reference signals applied to the comparators and/or in the comparing operations of the comparators, particularly in the first and second conversion stages 112 and 113.

In the above described analog to digital converter 10' according to this invention, the desired offset of the range of the voltage level reference signals applied to the comparators in the fine or second parallel conversion stage or unit 13', that is, the offset of the converting range of such unit 13', in respect to the steps in the voltage level reference signals applied to the comparators in the coarse or first parallel conversion stage or unit 12' has been provided by upwardly offsetting the voltage level reference signals in stage 12', for example, from $E_s$, $2E_s$, $3E_s$---$31E_s$ to $(1+\frac{1}{2})E_s$, $(2+\frac{1}{2})E_s$, $(3+\frac{1}{2}E_s)$---$(31+\frac{1}{2})E_s$, respectively. However, if desired, the advantages of this invention can be similarly realized by downwardly offsetting the voltage level reference signals applied to the comparators of the first or coarse parallel conversion unit or stage.

Figure 6:
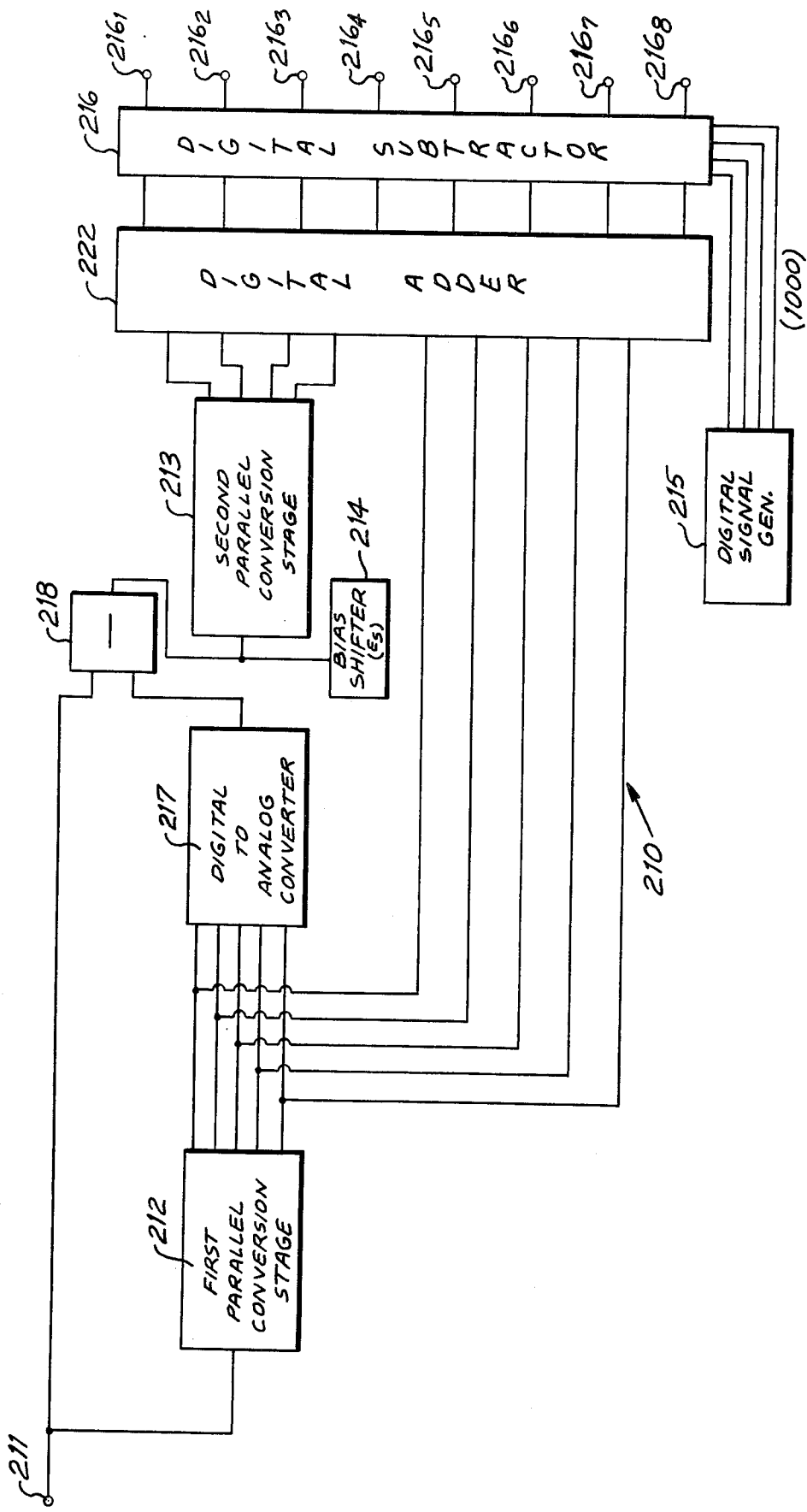
FIG. 6 is a schematic diagram illustrating a parallel-serial analog to digital converter according to still another embodiment of this invention.

For example, as shown on FIG. 6, an anlog to digital converter 210 according to this invention for converting an incoming video or other analog signal applied to an input terminal 211 into an 8-bit digital output may comprise a first or coarse parallel conversion unit or stage 212 having a 5-bit digital output and being generally similar to the conversion stage 12' of FIG. 3 in that it has $(2^5-1)$ or thirty-one comparators which compare the incoming analog signal with respective voltage level reference signals having magnitudes that descend in steps or increments of $E_s$. However, in the conversion stage 212, the successive voltage level reference signals are offset downwardly by, for example, $\frac{1}{2}E_s$, so that the smallest reference signal is $(1-\frac{1}{2})E_s$ or $\frac{1}{2}E_s$, and the remaining voltage level reference signals are $(2-\frac{1}{2})E_s$, $(3-\frac{1}{2})E_s$, ---$(31-\frac{1}{2})E_s$, as indicated at (I) on FIG. 7.

The 5-bit digital output from conversion stage 212 indicated at (II) on FIG. 7 is reconverted to an analog signal indicated at (III) on FIG. 7 in a digital to analog converter 217, and the resulting analog signal is subtracted from the sampled incoming analog signal applied to terminal 211 in a subtracter 218 so as to provide a difference analog signal indicated at (IV) on FIG. 7. In the converter 210, a bias of, for example, $E_s$ is applied by a bias shifter 214 to the analog difference signal from subtracter 218 to provide a bias-shifted analog difference signal as indicated at (V) on FIG. 7. Such bias-shifted analog difference signal is then subjected to a fine conversion in the second or fine parallel conversion stage or unit 213 which may be the same as the stage or unit 13' previously described with reference to FIG. 3, and which provides a corresponding 4-bit digital output indicated at (VI) on FIG. 7. In the stage or unit 213, the bias-shifted analog difference signal is compared with voltage level reference signals having magnitudes which descend in unit increments of, for example, $2E_s/(2^K-1)$, that is $2E_s/15$, from a maximum voltage level reference signal of $2E_s$ to a minimum voltage level reference signal of $2E_s/15$. Thus, the range of the voltage level reference signals employed in conversion stage 213 is again larger than, and offset in respect to, the steps of the voltage level reference signals employed in the preceding conversion stage 212.

The 5-bit digital output from coarse conversion stage 212 and the 4-bit digital output from fine conversion stage 213 are applied to respective inputs of a digital adder 222 which gives equal weight to the least significant bit of the output from stage 212 and to the most significant bit of the output from stage 213 so as to provide a resulting 8-bit digital output, as indicated at (VII) on FIG. 7. Finally, as shown, a generator 215 provides a 4-bit digital output 1000 which corresponds to the voltage value $E_s$, and which is subtracted digitally, in a digital subtracter 216, from the 8-bit digital output of adder 222 so as to provide an 8-bit digital output, indicated at (VIII) on FIG. 7, at the output terminals $216_1$–$216_8$ of the subtracter 216.

It will be seen from FIG. 7 that the parallel-serial analog to digital converter 210 according to this invention will provide an 8-bit digital character at the output of subtracter 216 which accurately corresponds to the sampled incoming analog signal even if the comparators of the coarse conversion stage or unit 212 do not accurately compare the signals applied thereto, or if the actual voltage level reference signals applied to such comparators have values $(1-\frac{1}{2})E'_s$, $(2-\frac{1}{2})E'_s$, $(3-\frac{1}{2})E'_s$---$(31-\frac{1}{2})E'_s$ which may differ from the respective desired values by as much as $\frac{1}{2}E_s$, as shown at (I) on FIG. 7. Increasing values of the incoming video or other analog signal applied to input terminal 211, as indicated at (I), will effect the changes in the logics of the 5-bit digital output from conversion stage 212 shown at (II). In response to such changes in the digital output from stage 212, the analog output from digital to analog converter 217 will vary in a stepwise manner, as indicated at (III), with each step in the output from converter 217 corresponding to a respective increment or step in the voltage level reference signals applied to the comparators in conversion stage 212. For variations of the incoming analog signal between the steps of the voltage level reference signals actually applied to the comparators in conversion stage 212, the bias-shifted difference analog signal applied to the fine conversion unit or stage 213 will always lie in the range between 0 and $2E_s$, as indicated at (V). Therefore, for variations of the incoming analog signal between two successive actual voltage level reference signals, for example, between $(1\frac{1}{2})E'_s$ and $(2\frac{1}{2})E'_s$, the four bits of digital information appearing at the output of stage 213 will have logics ranging from 0000 to 1111, as indicated at (VI) on FIG. 7.

When the 5-bit output from stage 212 is digitally added to the 4-bit output from stage 213 with the least significant bit of the output from stage 212 (II) being given the same weight as the most significant bit from stage 213 and the digital character 1000 is subtracted therefrom, the resulting 8-bit digital output from subtracter 216 has the logics indicated at (VIII) on FIG. 7. It will be seen that, even though the actual voltage level reference signals applied to the first and second comparators in conversion stage 212 are shown at (I) to have values $(1\frac{1}{2})E'_s$ and $(2\frac{1}{2})E'_s$ that are respectively greater than the intended values $(1\frac{1}{2})E_s$ and $(2\frac{1}{2})E_s$, the 8-bit digital character obtained from subtracter 216 for a sampled incoming analog signal ranging, for example, from $E_s$ to $2E_s$, correctly has logics ranging from 00001000 to 00001111, as shown at (VIII) on FIG. 7.

Accordingly, when the digital output from converter 210 is subsequently reconverted to analog form, the resulting analog signal will accurately correspond to the original incoming analog signal.

Although illustrative embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An analog to digital converter comprising: a plurality of parallel conversion units in a serial arrangement comprising a preceding parallel conversion unit and a following parallel conversion unit for specifying respective groups of decreasingly significant bits of a digital character, each of said parallel conversion units including a number of comparators having first inputs for receiving an analog signal and second inputs for receiving respective voltage level reference signals, and encoder means receiving the outputs of said comparators for providing an encoded output specifying the most significant group of bits of a digital character corresponding to the analog signal received by said first inputs of the respective comparators; an input terminal for receiving a sampled analog input signal said input terminal being connected to said first inputs of the comparators in said preceding parallel conversion unit to supply said sampled analog signal thereto; means interposed in said serial arrangement of parallel conversion units for reconverting the most significant group of bits to an analog signal and subtracting the reconverted analog signal from said sampled analog input signal to produce an analog difference signal and for applying the analog difference signal to said first inputs of the comparators in the following parallel conversion unit; means for applying to said second inputs of the comparators in each of said parallel conversion units voltage level reference signals of magnitudes which descend in respective voltage steps, with the lowest voltage level reference signal applied to the lowest level comparator of the preceding parallel conversion unit being substantially different from the remaining voltage level reference signals for each of the other comparators in the preceding parallel conversion unit and the range of the voltage level reference signals for said following parallel conversion unit being larger than, and offset in respect to, said steps of the voltage level reference signals for said preceding parallel conversion unit; and digital adding means adding the encoded outputs of all of said parallel conversion units with the least significant bit of the encoded output from said preceding parallel conversion unit and the most significant bit of the encoded output from said following parallel conversion unit being accorded the same weight.

2. An analog to digital converter according to claim 1 in which said preceding parallel conversion unit is a coarse parallel conversion unit and said following parallel conversion unit is a fine parallel conversion unit, and said steps between the successive voltage level reference signals applied to the comparators in said coarse conversion unit are substantially equal to each other and are different from the lowest of said voltage level reference signals applied to said lowest level comparator in said coarse conversion unit.

3. An analog to digital converter according to claim 2 in which said lowest voltage level reference signal applied to said lowest level comparator in said coarse conversion unit is substantially larger than each of the rest of said steps between the successive voltage level reference signals applied to the other comparators in said coarse conversion unit.

4. An analog to digital converted according to claim 3 in which said lowest of the voltage level reference signals applied to said lowest level comparator in said coarse conversion unit has a value of approximately $(1+\frac{1}{2})E_s$ with $E_s$ being approximately the value of the voltage of the remainder of said steps between the successive voltage level reference signals in said coarse conversion unit, and each of said steps of the voltage level reference signals applied to comparators in said fine conversion unit have values of approximately $2E_s/(2^K-1)$ with K being the number of bits of said digital character in said encoded output from said fine conversion unit.

5. An analog to digital converter according to claim 4 in which said encoded output from said coarse conversion unit is made up of 5-bits of said digital character, said encoded output from said fine conversion unit is made up of 4-bits of said digital character, and the least significant bit from said coarse conversion unit is accorded the same weight as the most significant bit from the fine conversion unit so that the output from said digital adding means is an 8-bit digital character.

6. An analog to digital converter according to claim 2 in which said lowest voltage level reference signal applied to said lowest level comparator in said coarse conversion unit has a value substantially smaller than each of the rest of said steps between the successive voltage level reference signals applied to the other comparators in said coarse conversion unit.

7. An analog to digital converter according to claim 6 in which said smallest voltage level reference signal applied to a comparator in said coarse conversion unit has a value of approximately $1/2E_s$ with $E_s$ being approximately the voltage value of said steps between the successive voltage level reference signals in said first conversion unit, said range of the voltage level reference signals in said fine conversion unit is approximately $2E_s$, and said steps of the voltage level reference signals in said fine conversion unit have values of $2E_s/(2^K-1)$ with K being the number of bits of said digital character in said encoded output from said fine conversion unit.

8. An analog to digital converter according to claim 7 in which said encoded output from said coarse conversion unit is a 5-bit digital output, and said encoded output from said fine conversion unit is a 4-bit digital output so that the output from said digital adding means is an 8-bit digital character.

9. An analog to digital converter according to claim 7 further comprising: means for upwardly biasing said analog difference signal by the voltage value $E_s$, and means for digitally subtracting said digital voltage representing the voltage value $E_s$ from the output obtained from said digital adding means.

10. An analog to digital converter according to claim 1; in which said parallel conversion units comprise first, second and third parallel conversion units for effecting coarse, finer and finest conversions, respectively, of the sampled analog input signal; and said digital adding means includes a first digital adder for adding the encoded outputs from said first and second conversion units, and a second digital adder for adding the digital output of said first digital adder and the encoded output from said third conversion unit.

11. An analog to digital converter according to claim 10 in which said steps between the successive voltage level reference signals above said lowest level reference signal in said first conversion unit are equal to each other and are each smaller than the lowest level said reference signal in said first conversion unit, and steps between said successive voltage level reference signals in said second conversion unit are equal to each other and are each smaller than the smallest of said voltage level reference signals in said first conversion unit.

12. An analog to digital converter according to claim 11 in which said lowest level reference signal in said first conversion unit has a value of approximately $(1+\frac{1}{2})E_s$ with $E_s$ being approximately the value of said steps between the successive voltage level reference signals above said lowest level in said first conversion unit; said lowest level reference signal in said second conversion unit has a value of approximately $3E_s/(2^K-1)$ with K being the number of bits in said encoded output from said second conversion unit, and said steps between the successive voltage level reference signals in said second conversion unit above said lowest level in said second conversion unit each have a value of approximately $2E_s/(2^K-1)$; and the lowest of said voltage level reference signals in said third conversion unit has a value of approximately $$\frac{4E_s}{(2^K-1)(2^{K'}-1)},$$

with $K'$ being the number of bits in the encoded output from said third conversion unit, and the steps between the successive voltage level reference signals in said third conversion unit are each substantially equal to said value of the lowest level reference signal in said third conversion unit.

13. An analog to digital converter according to claim 12 in which the encoded outputs from said first and second conversion units are respective 5-bit characters, the encoded output from said third conversion unit is a 4-bit character, the least significant bit from said first conversion unit being accorded the same weight as the most significant bit from the second conversion unit, and the least significant bit from the second conversion unit accorded the same weight as the most significant bit from the third conversion unit so that the output of said second digital adder is a 12-bit digital character.

14. An analog to digital converter according to claim 12; in which the range of said voltage level reference signals in said second conversion unit is approximately $2E_s$, and the range of said voltage level reference signals in said third conversion unit is approximately $4E_s/(2^K-1)$.

* * * * *